US009281492B2

(12) United States Patent
Min et al.

(10) Patent No.: US 9,281,492 B2
(45) Date of Patent: Mar. 8, 2016

(54) ELECTRO-OPTIC DEVICE AND METHOD FOR MANUFACTURING SAME

(75) Inventors: Chon Kyu Min, Yongin-si (KR); Hyung Il Jeon, Yongin-si (KR)

(73) Assignee: Jusung Engineering Co., Ltd., Gwangju-si (KR)

( * ) Notice: Subject to any disclaimer, the term of this patent is extended or adjusted under 35 U.S.C. 154(b) by 190 days.

(21) Appl. No.: 13/805,335
(22) PCT Filed: Jun. 15, 2011
(86) PCT No.: PCT/KR2011/004366
§ 371 (c)(1),
(2), (4) Date: Jan. 11, 2013
(87) PCT Pub. No.: WO2011/159094
PCT Pub. Date: Dec. 22, 2011

(65) Prior Publication Data
US 2013/0168661 A1      Jul. 4, 2013

(30) Foreign Application Priority Data
Jun. 18, 2010   (KR) .................... 10-2010-0058092

(51) Int. Cl.
*H01L 51/52*     (2006.01)
*H01L 51/56*     (2006.01)
*H01L 27/32*     (2006.01)

(52) U.S. Cl.
CPC ........ *H01L 51/5203* (2013.01); *H01L 51/5212* (2013.01); *H01L 51/56* (2013.01); *H01L 27/3288* (2013.01)

(58) Field of Classification Search
CPC . H01L 27/3276; H01L 33/62; H01L 27/3288; H01L 51/5203; H01L 51/5206; H01L 51/5209; H01L 51/5215; H01L 51/5225; H01L 51/5228; H01L 51/5234
See application file for complete search history.

(56) References Cited

U.S. PATENT DOCUMENTS 6,930,448 B2      8/2005 Kim
2002/0014837 A1 *  2/2002 Kim et al. ............... 313/505

(Continued)

FOREIGN PATENT DOCUMENTS

CN         1329455 A        1/2002
JP       2003045674 A        2/2003

(Continued)

OTHER PUBLICATIONS

Kazuhiro Takahashi; "Organic El Element"; Espacenet, Bibliographic data; Japanese Publication No. JP2008010244 (A); Publication Date: Jan. 17, 2008; 2 pgs.; Worldwide Database, http://worldwide.espacenet.com/publicationDetails/biblio?CC=JP&NR=2008010244A& . . . .

(Continued)

*Primary Examiner* — Evan Pert
*Assistant Examiner* — Leslie Pilar Cruz
(74) *Attorney, Agent, or Firm* — Andrew D. Fortney; Central California IP Group, P.C.

(57) ABSTRACT

According to the present invention, an electro-optic device comprises: a substrate which is split into a light emitting unit and a non-light emitting unit, wherein said light emitting unit is divided into a plurality of driving regions; an electrode pad which is formed in the non-light emitting unit of the substrate; and an electrode unit which comprises a plurality of supplementary electrodes each of which has one end connected to the electrode pad and has the other end connected to the centers of each of the plurality of driving regions, and transparent electrodes formed on the upper sides of the plurality of supplementary electrodes in the light emitting unit, wherein the area of each of the plurality of driving regions is set to an area in which no voltage drop occurs, and the plurality of supplementary electrodes are manufactured in the same length. Thus, according to the present invention, if power is supplied to each one end of the plurality of supplementary electrodes by using the electrode pad, the power is transmitted, at the same time, to the other ends of each of the plurality of supplementary electrodes. Therefore, the power is simultaneously supplied to each center of the plurality of driving regions regardless of the distance between the electrode pad and the driving regions. Further, as mentioned above, a voltage drop phenomenon is prevented since the light emitting unit is divided into the plurality of driving regions in which no voltage drop occurs. That is to say, uniform currents can flow on the front side of each driving region irrespective of the distance between the supplementary electrodes and the driving regions. Consequently, a large-scaled organic light emitting device which can show uniform brightness properties in the overall light emitting unit can be manufactured.

19 Claims, 5 Drawing Sheets

(56) References Cited

U.S. PATENT DOCUMENTS

| | | | |
|---|---|---|---|
| 2002/0158835 A1* | 10/2002 | Kobayashi et al. | 345/100 |
| 2003/0038591 A1 | 2/2003 | Kim | |
| 2007/0216845 A1 | 9/2007 | Liao et al. | |
| 2007/0222380 A1* | 9/2007 | Yamazaki et al. | 313/509 |

FOREIGN PATENT DOCUMENTS

| | | |
|---|---|---|
| JP | 2008-10244 A | 1/2008 |
| KR | 2003-0017696 A | 3/2003 |
| KR | 10-2005-0027464 B1 | 2/2006 |
| KR | 10-2007-0070592 A | 7/2007 |
| WO | 2008126269 A1 | 10/2008 |

OTHER PUBLICATIONS

Chang Nam Kim; "Organic Electroluminescence Device"; Espacenet, Bibliographic data; Korean Publication No. KR20030017696 (A); Publication Date: Mar. 4, 2003; 2 pgs.; Worldwide Database, http://worldwide.espacenet.com/publicationDetails/biblio?DB=EPODOC&II=1&ND=3& . . . .

Hong Gyu Kim; "Top-Emittion OLED and Method of Manufacturing for the Same"; Espacenet, Bibliographic data; Korean Publication No. KR20070070592 (A); Publication Date: Jul. 4, 2007; Worldwide Database, http://worldwide.espacenet.com/publicationDetails/biblio?DB=EPODOC&II=1&D=3& . . . .

Won Kyu Kwak and Kwan Hee Lee; "Top Emission Organic Electroluminescence Display Device for Preventing an Upper Electrode Volatge from Dropping by Using an Assistant Electrode and a Fabrication Method Thereof, Particularly . . . "; Korean Patent Abstracts; Korean Publication No. 1020050027464 A; Publication Date: Mar. 21, 2005; Korean Intellectual Property Office, Republic of Korea.

International Search Report with English Translation; International Application No. PCT/KR2011/004366; Dated Jan. 19, 2012; 5 pages; International Searching Authority/Korean Intellectual Property Office, Republic of Korea.

Written Opinion of the International Searching Authority with English Translation; International Application No. PCT/KR2011/004366; Dated Jan. 19, 2012; 7 pages; International Searching Authority/Korean Intellectual Property Office, Republic of Korea.

International Preliminary Report on Patentability; International Application No. PCT/KR2011/004366; Jan. 19, 2012; The International Bureau of WIPO, Geneva, Switzerland.

Akinori Hayafuji; "Light Emitting Device"; Bibliographic Data of WO2008126269 (A1); Oct. 23, 2008; 2 pgs.; http://worldwide.espacenet.com.

Hanami Takayoshi; "Organic Electroluminescent Element"; Abstract of JP2003045674 (A); Feb. 14, 2003; http://worldwide.espacenet.com.

Chang-Nam Kim et al.; "Panchromatic Organic Electroluminescent Display Screen and Its Making Method and Drinking Circuit"; Abstract of CN1329455 (A); Jan. 2, 2002; http://sipo.gov.cn.

* cited by examiner

ELECTRO-OPTIC DEVICE AND METHOD FOR MANUFACTURING SAME

CROSS-REFERENCE TO RELATED APPLICATION

This application claims priority to Korean Patent Application No. 10-2010-0058092 filed on Jun. 18, 2010 and all the benefits accruing therefrom under 35 U.S.C. §119, the contents of which are incorporated by reference in their entirety.

BACKGROUND

The present disclosure relates to an electro-optic device and a method of manufacturing the electro-optic device, and more particularly, to an electro-optic device having uniform brightness, and a method of manufacturing the electro-optic device.

In general, an organic light emitting device includes a substrate, a transparent electrode disposed on the substrate, an organic layer disposed on the transparent electrode, and a negative electrode disposed on the organic layer. In this case, the transparent electrode is used as a positive electrode. A positive electrode pad for applying power to the transparent electrode, and a negative electrode pad for applying power to the negative electrode are disposed at a side of the substrate. The transparent electrode is formed of a transparent conductive material such as indium tin oxide (ITO) and indium zinc oxide (IZO), and the negative electrode is formed of a metal. The organic layer includes a hole injection layer, a hole transport layer, an emitting layer, and an electron transport layer. A method of driving the organic light emitting device will now be described. When power is applied to the transparent electrode and the negative electrode through the positive electrode pad and the negative electrode pad, holes migrate from the transparent electrode to the emitting layer through the hole injection layer and the hole transport layer, and electrons migrate from the negative electrode to the electron transport layer. The holes and electrons form electron-hole pairs in the emitting layer to generate excitons having high energy. The excitons decay to a ground state having low energy to emit light.

Such organic light emitting devices may have a large area to be used for a lighting device. A typical transparent conductive material is higher in resistivity than a metal. Thus, when power is applied to a transparent electrode through a positive electrode pad to drive an organic light emitting device having a large area, current applied to a portion of the transparent electrode distant from the positive electrode pad is lower than current applied to a portion of the transparent electrode adjacent to the positive electrode pad. That is, as a distance from an electrode pad increases, a current density decreases, which is called voltage drop (IR drop). The voltage drop may cause uneven brightness of an organic light emitting device having a large area.

To address the voltage drop, a plurality of auxiliary electrodes are formed of a metal having high conductivity and low resistivity on a transparent electrode. For example, the auxiliary electrodes may be spaced a constant distance from each other on the transparent electrode. Accordingly, the auxiliary electrodes divide the transparent electrode into a plurality of regions, each of which is defined as a light emitting region. Thus, when power is supplied to the auxiliary electrodes through an electrode pad, electric current flows to the auxiliary electrodes having low resistance, and then, is transmitted to the transparent electrode under the auxiliary electrodes. However, a portion of the transparent electrode adjacent to the auxiliary electrode is greater in current density than a portion of the transparent electrode distant from the auxiliary electrode. That is, as a distance from the auxiliary electrode increases, a current density decreases, and thus, voltage drop still occurs. Accordingly, a central portion of the light emitting region distant from the auxiliary electrode is lower in brightness than an edge of a panel adjacent to the auxiliary electrode. Thus, it is difficult to manufacture an organic light emitting device having uniform brightness and a large area.

SUMMARY

The present disclosure provides an electro-optic device having uniform brightness, and a method of manufacturing the electro-optic device.

The present disclosure also provides an electro-optic device that prevents voltage drop to entirely apply uniform current to a transparent electrode, and a method of manufacturing the electro-optic device.

In accordance with an exemplary embodiment, an electro-optic device includes: a substrate including a light emitting part and a non-emitting part, and divided into a plurality of driving regions to prevent voltage drop in the light emitting part; an electrode pad disposed on the non-emitting part; a plurality of auxiliary electrodes each having an end connected to the electrode pad and the other end connected to a central portion of each of the driving regions; and a transparent electrode disposed on the auxiliary electrodes over the light emitting part.

The driving regions may have the same area.

The auxiliary electrodes may have the same length.

As a distance between the auxiliary electrode and the electrode pad decreases, the number of bent portions of the auxiliary electrode may increase.

A first dielectric may be disposed between the auxiliary electrode and the transparent electrode, a contact hole may expose at least one portion of an upper portion of the auxiliary electrode on the central portion of the driving region, and the transparent electrode may be connected to the auxiliary electrode through the contact hole.

The electro-optic device may include a second dielectric on the transparent electrode over the contact hole.

The electro-optic device may include an organic layer disposed on the transparent electrode, and an upper electrode disposed on the organic layer.

In accordance with another exemplary embodiment, a method of manufacturing an electro-optic device includes: dividing a light emitting part of a substrate into a plurality of driving regions to prevent voltage drop; forming an electrode pad on a non-emitting part of the substrate; forming a plurality of auxiliary electrodes each having an end connected to the electrode pad and the other end connected to a central portion of each of the driving regions; and forming a transparent electrode on the auxiliary electrodes over the light emitting part.

In the forming of the auxiliary electrodes, the auxiliary electrodes may have the same length.

In the dividing of the light emitting part, the driving regions may have the same area.

As a distance between the auxiliary electrode and the electrode pad decreases, the number of bent portions of the auxiliary electrode may increase.

After the forming of the auxiliary electrodes, a first dielectric may be formed on the substrate and the auxiliary electrodes, and a portion of the first dielectric may be removed to form a contact hole that exposes at least one portion of the auxiliary electrode on the central portion of each of the driving regions.

A second dielectric may be formed on the transparent electrode over the contact hole.

An organic layer may be formed on the transparent electrode, and an upper electrode may be formed on the organic layer.

BRIEF DESCRIPTION OF THE DRAWINGS

Exemplary embodiments can be understood in more detail from the following description taken in conjunction with the accompanying drawings, in which:

FIGS. 1 to 6 are views illustrating a method of manufacturing an electrode part on a substrate in accordance with an exemplary embodiment;

DETAILED DESCRIPTION OF EXEMPLARY EMBODIMENTS

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1A:
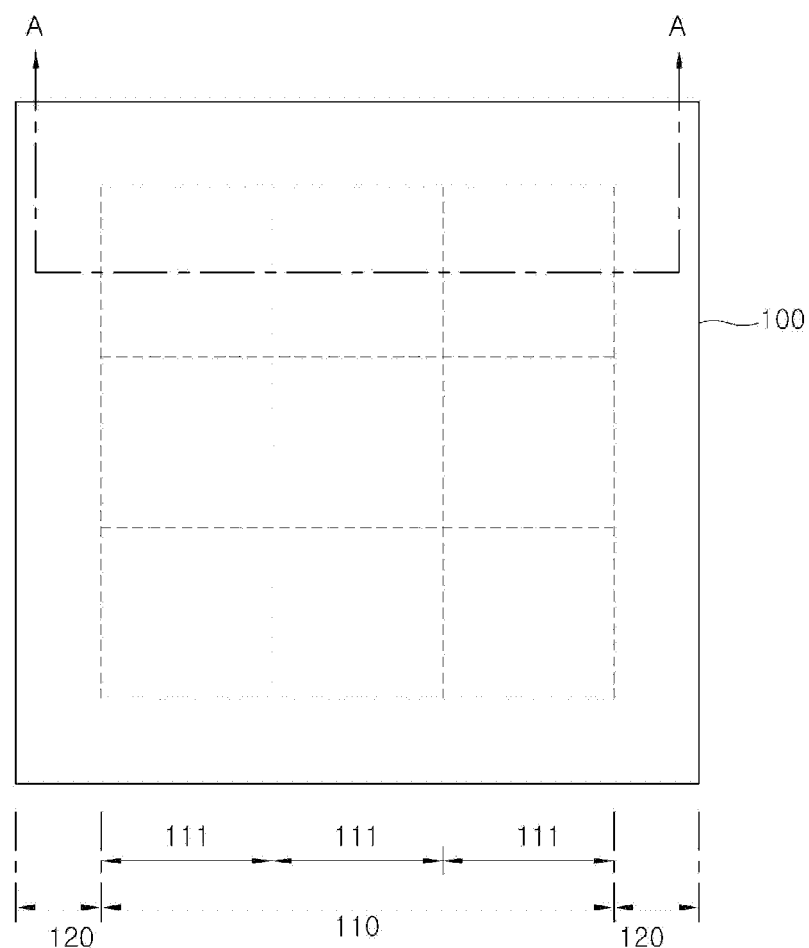
FIG. 1A is a plan view illustrating the substrate divided into a plurality of driving regions.

FIGS. 1A to 6 are views illustrating a method of manufacturing an electrode part on a substrate in accordance with an exemplary embodiment. Particularly, FIG. 1A is a plan view illustrating the substrate divided into a plurality of driving regions, and FIG. 1B is a cross-sectional view taken along line A-A' of FIG. 1A. In addition, FIG. 2A is a plan view illustrating auxiliary electrodes formed on the substrate, and FIG. 2B is a cross-sectional view taken along line B-B' of FIG. 2A.

Figure 1B:
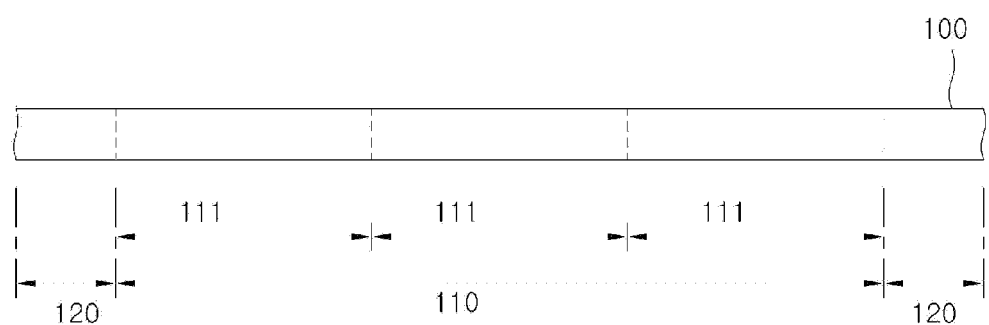
FIG. 1B is a cross-sectional view taken along line A-A' of FIG. 1A.

A substrate 100 according to the current embodiment is used to manufacture an electro-optic device having a large area and used for lighting, and has a size of 2 inch or greater. The substrate 100 may be one of a glass substrate and a plastic substrate such as a substrate formed of PE, PES, and PEN, which have a transmissivity of approximately 80% or greater. A light emitting part 110 includes a transparent electrode 240 to emit light, and a non-emitting part 120 is out of the transparent electrode 240. The light emitting part 110 is disposed in the central region of the substrate 100, and the non-emitting part 120 is disposed in the edge of the substrate 100. The light emitting part 110 of the substrate 100 is divided into a plurality of regions as illustrated in FIGS. 1A and 1B. Each of the regions has an area to prevent voltage drop. Hereinafter, the regions without voltage drop are referred to as driving regions 111. The area of each of the driving regions 111 may be maximized in a range without voltage drop. In this case, the driving regions 111 have the same area. However, the present disclosure is not limited thereto, and thus, the driving regions 111 may have an area smaller than the maximized area.

Figure 2A:
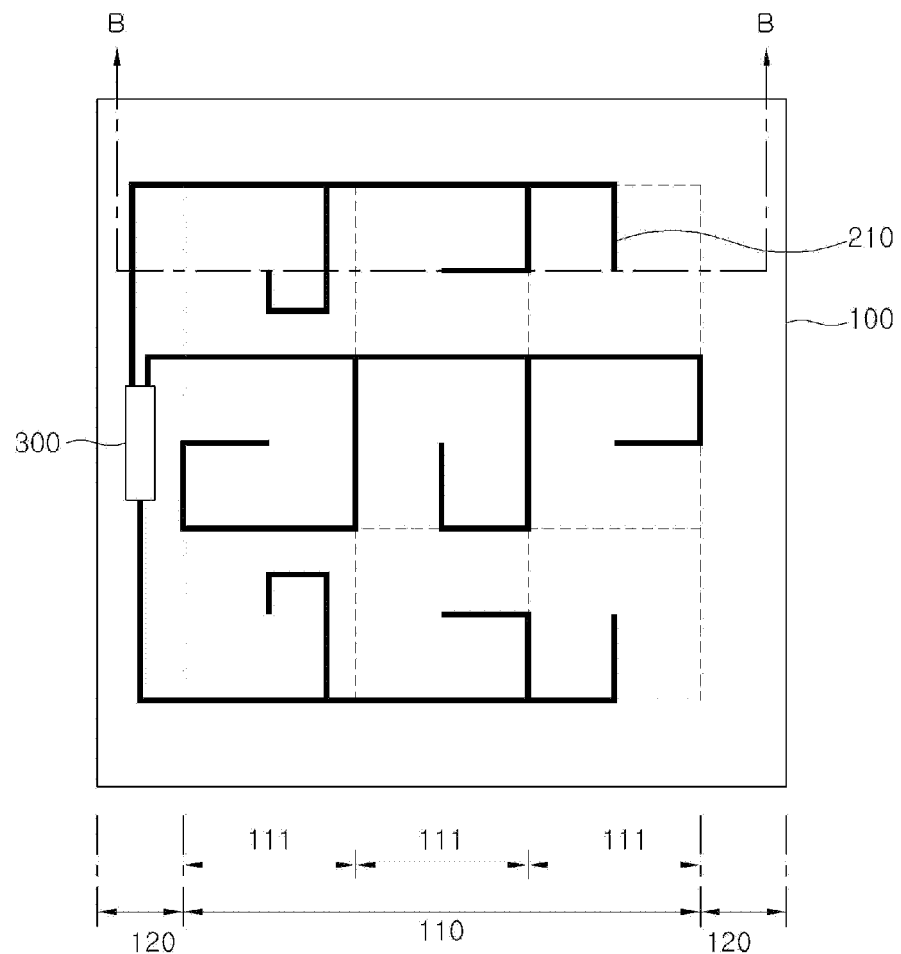
FIG. 2A is a plan view illustrating auxiliary electrodes formed on the substrate.
Figure 2B:
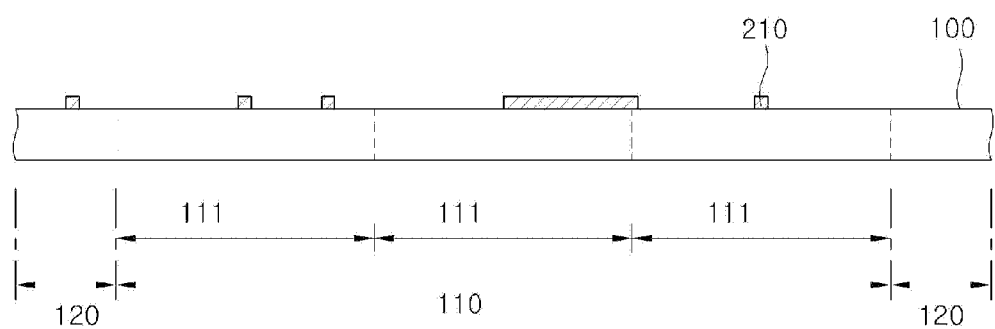
FIG. 2B is a cross-sectional view taken along line B-B' of FIG. 2A.

Referring to FIGS. 2A and 2B, an electrode pad 300 and a plurality of auxiliary electrodes 210 are formed on the substrate 100. The electrode pad 300 is connected to a driver (not shown) for driving an electro-optic device, to transmit electric current and a driving signal to the auxiliary electrodes 210. The auxiliary electrodes 210 transmit power from the electrode pad 300 to the transparent electrode 240 that is formed later. The electrode pad 300 is disposed on the non-emitting part 120 at a side of the light emitting part 110. The auxiliary electrodes 210 connect the electrode pad 300 to central portions of the driving regions 111, respectively. The central portion includes the center of the driving region 111 and an area adjacent to the center. The number of the auxiliary electrodes 210 may correspond to the number of the driving regions 111 formed by dividing the light emitting part 110. Accordingly, ends of the auxiliary electrodes 210 are connected to the electrode pad 300, and the other ends thereof are connected to the central portions of the driving regions 111. Thus, since the other ends of the auxiliary electrodes 210 are disposed on the central portions of the driving regions 111, distances between the other ends of the auxiliary electrodes 210 and the boundaries of the driving regions 111 are uniform. Accordingly, when power is supplied to the transparent electrode 240 of the driving region 111 from the other end of the auxiliary electrode 210 on the central portion of the driving region 111, current can be uniformly transmitted. For example, when the other end of the auxiliary electrode 210 is connected to a portion of the driving region 111 out of the central portion thereof, power supplied from the other end of the auxiliary electrode 210 is unevenly transmitted to the driving region 111. Thus, current is unevenly transmitted to the transparent electrode 240 of the driving region 111. Since the electrode pad 300 is disposed in the non-emitting part 120 at a side of the light emitting part 110, distances between the electrode pad 300 and the central portions of the driving regions 111 are different from one another. Thus, the auxiliary electrodes 210 have the same length to simultaneously supply power to the central portions of the driving regions 111, regardless of the distances between the electrode pad 300 and the central portions of the driving regions 111. That is, distances between the ends of the auxiliary electrodes 210 connected to the electrode pad 300 and the other ends thereof connected to the central portions of the driving regions 111 are the same. To this end, a region between the ends of the auxiliary electrode 210, that is, a path between the ends of the auxiliary electrode 210 can be varied such that the distances between the ends of the auxiliary electrodes 210 and the other ends thereof are the same. For example, the auxiliary electrode 210 may have a line shape as illustrated in FIG. 2A, and the number of bent portions of the auxiliary electrodes 210 closer to the electrode pad 300 is greater. Accordingly, when power is supplied to the ends of the auxiliary electrodes 210 through the electrode pad 300, the power is simultaneously transmitted to the other ends of the auxiliary electrodes 210. This is because the auxiliary electrodes 210 have the same length and thus paths through which power is supplied have the same length. Accordingly, power is simultaneously supplied to the central portions of the driving regions 111. The auxiliary electrodes 210 may include one of a metal such as Au, Ag, Cu, and Al, and a transparent conductive material such as indium tin oxide (ITO), indium zinc oxide (IZO), zinc oxide (ZnO), and $In_2O_3$. In accordance with the current embodiment, Ag paste is printed using a printing method, and then, is dried to form the auxiliary electrodes 210. Alternatively, the auxiliary electrodes 210 may be formed by depositing a transparent conductive material or a metal may be deposited on the substrate 100 using one of a sputtering method, an ion beam deposition method, an electron vapor deposition method, and a plasma beam deposition method. At this point, the electrode pad 300 is formed on the non-emitting part 120 of the substrate 100. That is, the auxiliary electrodes 210 and the electrode pad 300 are formed using the same material and method. However, the present disclosure is not limited thereto, and thus, the auxiliary electrodes 210 may be formed after the electrode pad 300 is formed, or the electrode pad 300 may be formed after the auxiliary electrodes 210 are formed.

Figure 3:
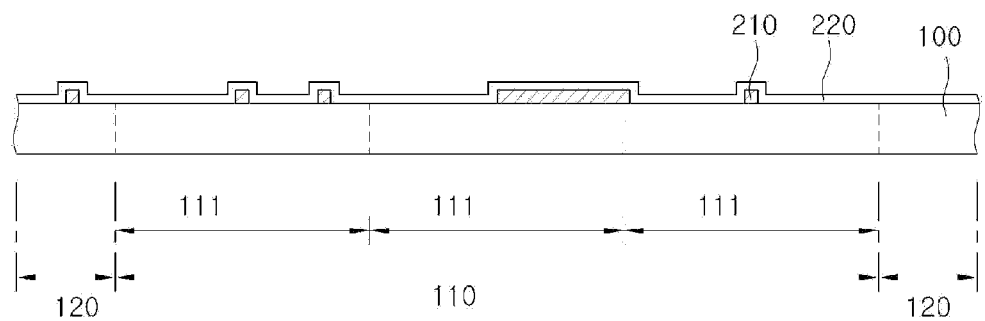

Referring to FIG. 3, a first dielectric 220 is formed on the substrate 100 provided with the auxiliary electrodes 210. At this point, although not shown, at least one portion of the electrode pad 300 may be open. To this end, the first dielectric 220 is formed entirely on the substrate 100, and then, at least one portion of the electrode pad 300 is exposed through an etching process. However, the present disclosure is not limited thereto, and thus, a shadow mask that exposes at least one portion of the electrode pad 300 may be placed on the substrate 100, and then, a dielectric may be deposited thereon through a deposition process to form the first dielectric 220. At least one of an oxide such as alumina ($Al_2O_3$), and an inorganic material such as a nitride may be deposited on the substrate 100 by using one of an ion beam deposition method, an electron vapor deposition method, a plasma beam deposition method, and a chemical vapor deposition, thereby forming the first dielectric 220. However, the present disclosure is not limited thereto, and thus, the first dielectric 220 may be formed using a thermosetting or photo-curable material, such as a photoresist, in the form of liquid or paste.

Figure 4:
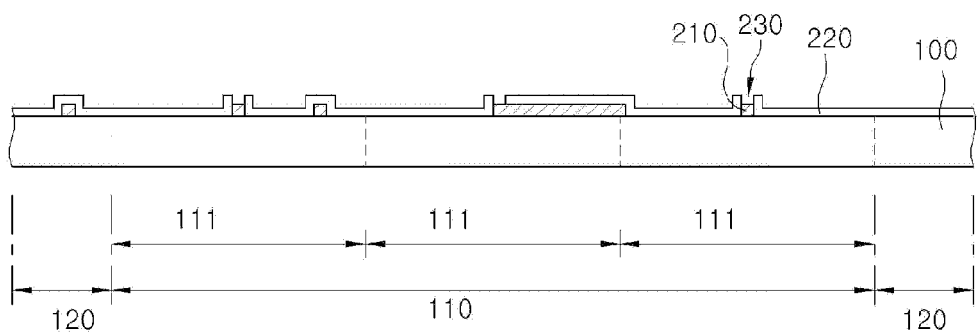

Referring to FIG. 4, a contact hole 230 that exposes a portion of the auxiliary electrode 210 may be formed by removing a portion of the first dielectric 220. The contact hole 230 exposes the upper portion of the auxiliary electrode 210 on the central portion of each of the driving regions 111. In accordance with the current embodiment, the contact holes 230 are formed through a laser scribing process. In detail, an etch mask having openings for at least partially opening the auxiliary electrodes 210 corresponding to the central portions of the driving regions 111 is placed on the substrate 100. A laser beam is emitted to the openings of the etch mask from the upper side thereof, to partially remove the first dielectric 220. Accordingly, the contact holes 230 exposing the upper portions of the auxiliary electrodes 210 on the central portions of the driving regions 111 are formed, as illustrated in FIG. 4. The laser beam used in the laser scribing process may be one of Nd:YLF (Nd:$LiYF_4$), Nd:YAG (Nd:$Y_3Al_5O_{12}$), Nd:YVO (Nd:$YVO_4$), Nd:LSB (Nd:$LaSc_3(BO_3)_4$), and Nd:NNO (Nd:$NiNbO_3$). After that, particles generated during the laser scribing process are removed with a suction device using a dry cleaning method. However, a method of forming the contact holes 230 is not limited thereto, and thus, various methods such as a photolithography method, a wet etch method using an etch solution, a reactive ion etching (RIE) method, and a dry etching method may be used.

Figure 5:
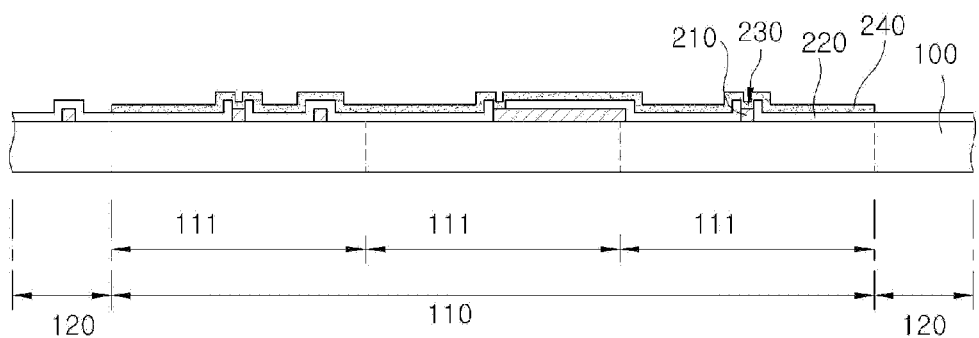

Referring to FIG. 5, the transparent electrode 240 is formed on the first dielectric 220 and the auxiliary electrodes 210 to correspond to the light emitting part 110 of the substrate 100. Since the contact holes 230 expose the upper portions of the auxiliary electrodes 210 on the central portions of the driving regions 111, the transparent electrode 240 is connected to the auxiliary electrodes 210 through the contact holes 230. In accordance with the current embodiment, ITO as a transparent conductive material is deposited through a sputtering process to form the transparent electrode 240. However, but the present disclosure is not limited thereto, and thus, various transparent conductive materials such as IZO, ZnO, and $In_2O_3$ may be used. In addition, instead of the sputtering process, various processes may be used to form the transparent electrode 240.

Figure 6:
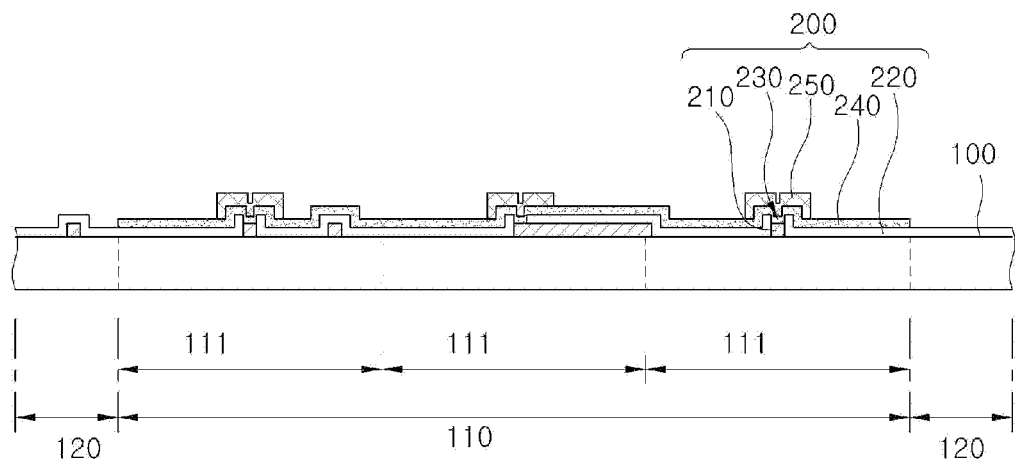

Thereafter, referring to FIG. 6, a second dielectric 250 is formed on the transparent electrode 240 over the contact holes 230. The second dielectric 250 covers and insulates uneven upper portions of the transparent electrode 240 due to the contact holes 230, so as to prevent light from being emitted from the contact holes 230. That is, when the transparent electrode 240 is formed over the contact holes 230, the transparent electrode 240 may have an uneven surface, and thus, brightness of an electro-optic device may be uneven. Thus, the second dielectric 250 is formed over the contact holes 230 to insulate the transparent electrode 240 disposed over the contact holes 230 from an organic layer 400 that is formed later. A photoresist (PR) is printed on the transparent electrode 240 over the contact holes 230, and is photo-cured to form the second dielectric 250. However, a material used to form the second dielectric 250 is not limited thereto, and thus, various inorganic materials such as a nitride or an oxide may be deposited on the transparent electrode 240.

The light emitting part 110 of the substrate 100 is divided into the driving regions 111 in which no voltage drop occurs. The other ends of the auxiliary electrodes 210 are connected to the central portions of the driving regions 111, respectively. The auxiliary electrodes 210 connected from the electrode pad 300 to the central portions of the driving regions 111 have the same length. Accordingly, when power is supplied to the ends of the auxiliary electrodes 210 through the electrode pad 300, the power is simultaneously transmitted to the other ends of the auxiliary electrodes 210. Accordingly, the power is simultaneously supplied to the central portions of the driving regions 111. When the power is supplied to the other end of the auxiliary electrode 210 on the central portion of the driving region 111, current is uniformly transmitted to the transparent electrode 240 of the driving region 111. As described above, since the light emitting part 110 of the substrate 100 is divided into the driving regions 111 in which no voltage drop occurs, uniform current is applied entirely on a surface of each of the driving regions 111, regardless of distances from the auxiliary electrode 210.

Each of the driving regions 111 has a tetragonal shape. However, the present disclosure is not limited thereto, and thus, the driving region 111 may have one of various shapes such as a circular or polygonal shape.

Figure 7:
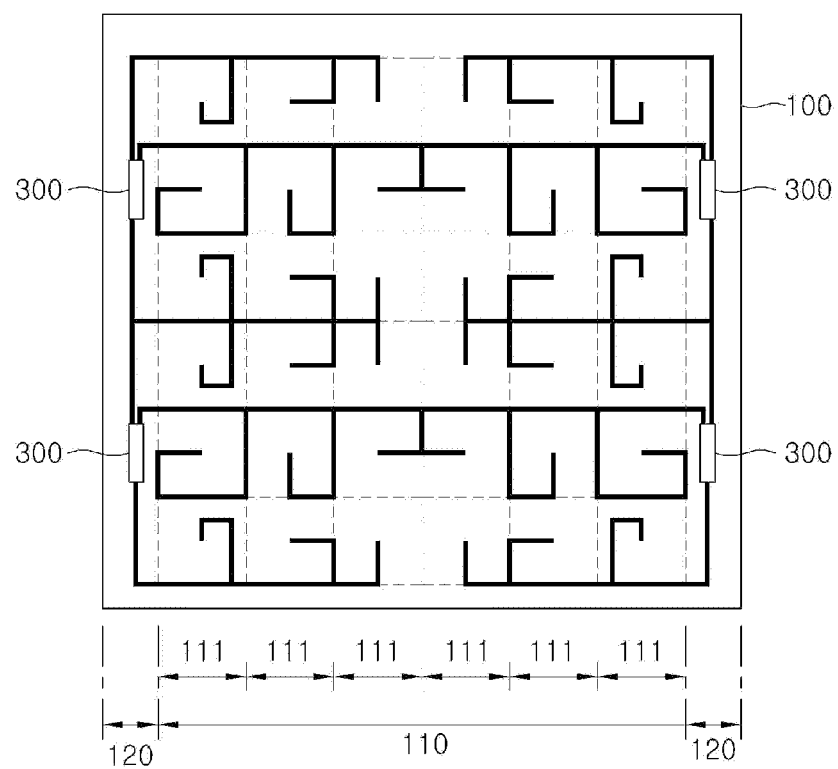
FIG. 7 is a view illustrating a method of manufacturing an electrode part in accordance with another embodiment.

FIG. 7 is a view illustrating a method of manufacturing an electrode part in accordance with another embodiment.

Although one electrode pad as the electrode pad 300 is disposed on the substrate 100 in FIG. 2A, the substrate 100 may have a larger area, and thus, the number of the auxiliary electrodes 210 may be increased. For example, referring to FIG. 7, four electrode pads as the electrode pad 300 may be disposed on the substrate 100, and the auxiliary electrodes 210 may be connected to the electrode pads 300. In this case, the same number of the auxiliary electrodes 210 may be connected to each of the electrode pads 300. The auxiliary electrodes 210 connected from the electrode pads 300 to the central portions of the driving regions 111 have the same length. Accordingly, when power is supplied to the ends of the auxiliary electrodes 210 through the electrode pads 300, the power is simultaneously transmitted to the other ends of the auxiliary electrodes 210. Accordingly, the power is simultaneously supplied to the central portions of the driving regions 111. When the power is supplied to the other end of the auxiliary electrode 210 on the central portion of the driving region 111, current is uniformly transmitted to the transparent electrode 240 of the driving region 111. As described above, since the light emitting part 110 of the substrate 100 is divided into the driving regions 111 in which no voltage drop occurs, uniform current is applied entirely on a surface of each of the driving regions 111, regardless of distances from the auxiliary electrode 210. The number of the electrode pads 300 is four in the current embodiment, but is not limited thereto, and thus, may be less or more than 4.

Figure 8:
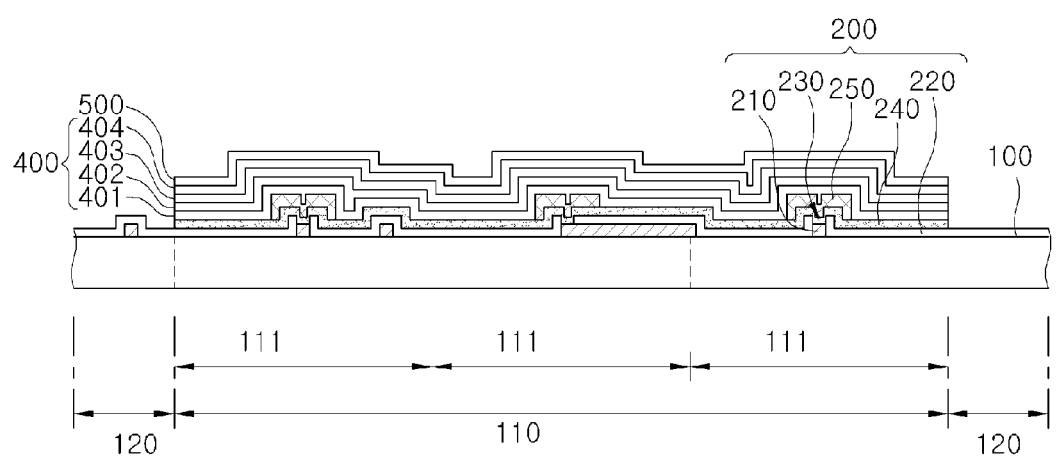
FIG. 8 is a cross-sectional view illustrating an electro-optic device including an electrode part and having a large area, in accordance with another embodiment.

FIG. 8 is a cross-sectional view illustrating an electro-optic device including an electrode part and having a large area, in accordance with another embodiment. Referring to FIGS. 1A to 6, and 8, a method of manufacturing the electro-optic device will now be described. The same part of the current embodiment as that of the previous embodiment will be briefly described, or a description thereof will be omitted.

The substrate 100 has an area of approximately 2-inch or greater to manufacture the electro-optic device that has a large area and is used for lighting. Electrode parts 200 are formed on the substrate 100. To this end, the light emitting part 110 of the substrate 100 is divided into the driving regions 111 having the same area as illustrated in FIGS. 1A and 1B. After that, referring to FIGS. 2A and 2B, the electrode pad 300 and the auxiliary electrodes 210 are formed on the substrate 100. The electrode pad 300 is disposed on the non-emitting part 120 at a side of the light emitting part 110. The ends of the auxiliary electrodes 210 are connected to the electrode pad 300, and the other ends thereof are connected to the central portions of the driving regions 111. The auxiliary electrodes 210 have the same length. Ag paste is printed, and is cured to form the auxiliary electrodes 210 and the electrode pad 300. An electrode pad (not shown) may be formed at a side of the non-emitting part 120 to apply power to an upper electrode 500 that is formed later. Subsequently, referring to FIG. 3, the first dielectric 220 is formed entirely on the substrate 100. The first dielectric 220 exposes at least one portion of the electrode pad 300 formed on the non-emitting part 120 of the substrate 100. Each of the contact holes 230 exposes at least one portion of the upper portion of the auxiliary electrode 210 on the central portion of each of the driving regions 111. Referring to FIG. 5, ITO as a transparent conductive material is formed on the first dielectric 220 and the auxiliary electrodes 210 to form the transparent electrode 240. At this point, the upper portions of the auxiliary electrodes 210 are connected to the transparent electrode 240 through the contact holes 230. Then, referring to FIG. 6, the second dielectric 250 is formed on the transparent electrode 240 over the contact holes 230.

Subsequently, referring to FIG. 8, the organic layer 400 is formed on the transparent electrode 240 out of the second dielectric 250. The organic layer 400 includes a hole injection layer 401, a hole transport layer (HTL) 402, an emitting layer (EML) 403, and an electron transport layer (ETL) 404. The organic layer 400 may be formed by sequentially stacking the hole injection layer 401, the hole transport layer 402, the emitting layer 403, and the electron transport layer 404. For example, the hole injection layer 401 may be formed of one of CuPc, 2-TNATA, and MTDATA on the transparent electrode 240. Then, the hole transport layer 402 is formed of a material such as NPB and TPD on the hole injection layer 401 to efficiently transport holes. Thereafter, the emitting layer 403 is formed on the hole transport layer 402. The emitting layer 403 is formed by doping DPVBi with rubrene to emit white light. However, the present disclosure is not limited thereto, and thus, various materials for emitting white light may be used. The emitting layer 403 may be formed of a material having excellent light emitting efficiency, such as a green light emitting layer including $Alq_3$:C545T, a blue light emitting layer including DPVBi, a red light emitting layer including CBP:Ir(acac), and a combination thereof. Thereafter, the electron transport layer 404 is formed of a material such as $Alq_3$ or Bebq2 on the emitting layer 403. The organic layer 400 is deposited using a thermal deposition method. Thereafter, the upper electrode 500 is formed on the organic layer 400. The electro-optic device is a rear emitting type device in which light is emitted toward the transparent electrode 240. Thus, the upper electrode 500 has high reflectivity by depositing a metal such as LiF—Al or Mg:Ag with a thickness of several nm or greater on the organic layer 400. Accordingly, light is emitted from the emitting layer 403 to the transparent electrode 240, not to the upper electrode 500. However, the present disclosure is not limited thereto, and thus, the electro-optic device may be a bidirectional emitting type device in which light is emitted toward both the transparent electrode 240 and the upper electrode 500. To this end, the upper electrode 500 may be formed by depositing a material such as Mg:Ag or Ca:Ag with a thickness of approximately several μm or less, so as to transmit light. A sealing substrate (not shown) coated with a sealing material is disposed on the upper electrode 500, and is adhered to the substrate 100 to seal the electro-optic device.

The light emitting part 110 of the substrate 100 is divided into the driving regions 111 in which no voltage drop occurs. The other ends of the auxiliary electrodes 210 are connected to the central portions of the driving regions 111, respectively. The auxiliary electrodes 210 connected from the electrode pad 300 to the central portions of the driving regions 111 have the same length. Accordingly, when power is supplied to the ends of the auxiliary electrodes 210 through the electrode pad 300, uniform current is applied entirely on the surface of each of the driving regions 111, regardless of distances from the auxiliary electrode 210. When the power is supplied to the other end of the auxiliary electrode 210 on the central portion of the driving region 111, current is uniformly transmitted to the transparent electrode 240 of the driving region 111. As described above, since the auxiliary electrodes 210 have the same length, power is simultaneously supplied to the central portions of the driving regions 111. Accordingly, an organic light emitting device having a large area and including the light emitting part 110 having entirely uniform brightness can be manufactured.

Although an organic light emitting device is exemplified as described above, the present disclosure is not limited thereto, and thus, various electro-optic devices including a transparent electrode may be exemplified.

In accordance with the above-described embodiments, the light emitting part of the substrate is divided into the driving regions in which no voltage drop occurs. The ends of the auxiliary electrodes are connected to the electrode pad, and the other ends thereof are connected to the centers of the driving regions, respectively. The auxiliary electrodes have the same length. Accordingly, when power is supplied to the ends of the auxiliary electrodes through the electrode pad, the power is simultaneously transmitted to the other ends of the auxiliary electrodes. Accordingly, the power is simultaneously supplied to the central portions of the driving regions, regardless of the distances between the electrode pad and the central portions of the driving regions. In addition, since the light emitting part of the substrate is divided into the driving regions in which no voltage drop occurs, voltage drop can be prevented in the electro-optic device. That is, uniform current is applied entirely on the surface of each of the driving regions, regardless of distances from the auxiliary electrode.

Accordingly, an organic light emitting device having a large area and including the light emitting part having entirely uniform brightness can be manufactured.

Although the electro-optic device and the method of manufacturing the same have been described with reference to the specific exemplary embodiments, they are not limited thereto. Therefore, it will be readily understood by those skilled in the art that various modifications and changes can be made thereto without departing from the spirit and scope of the present invention defined by the appended claims.

What is claimed is:

1. An electro-optic device comprising:
   a substrate comprising a light emitting part, a non-emitting part, and a plurality of driving regions to prevent voltage drop in the light emitting part;
   an electrode pad on the non-emitting part;
   a plurality of auxiliary electrodes, each having bent portions and same distances between an end connected to the electrode pad and another end connected to a central portion of each of the driving regions, wherein a number of bent portions of the auxiliary electrode increases as a distance between the auxiliary electrode and the electrode pad decreases; and
   a transparent electrode on the auxiliary electrodes over the light emitting part.

2. The electro-optic device of claim 1, wherein the driving regions have the same area.

3. The electro-optic device of claim 2, comprising an organic layer on the transparent electrode, and an upper electrode on the organic layer.

4. The electro-optic device of claim 1, further comprising a first dielectric between the auxiliary electrode and the transparent electrode, and a contact hole exposing at least one portion of an upper portion of the auxiliary electrode on the central portion of the driving region, wherein the transparent electrode is connected to the auxiliary electrode through the contact hole.

5. The electro-optic device of claim 4, comprising a second dielectric on the transparent electrode over the contact hole.

6. The electro-optic device of claim 4, comprising an organic layer on the transparent electrode, and an upper electrode on the organic layer.

7. The electro-optic device of claim 1, further comprising a hole transport layer on the transparent electrode, an emitting layer on the hole transport layer, an electron transport layer on the emitting layer, and a metal layer on the electron transport layer.

8. The electro-optic device of claim 1, comprising an organic layer on the transparent electrode, and an upper electrode on the organic layer.

9. The electro-optic device of claim 8, wherein the organic layer comprises a hole injection layer, a hole transport layer, an emitting layer, and an electron transport layer, the organic layer having a first thickness.

10. The electro-optic device of claim 9, wherein the upper electrode has a high reflectivity and a second thickness greater than the first thickness.

11. The electro-optic device of claim 1, wherein the light emitting part comprises the plurality of driving regions.

12. The electro-optic device of claim 1, wherein the driving regions have a tetragonal shape, a circular shape, or a polygonal shape.

13. The electro-optic device of claim 1, wherein each of the plurality of driving regions comprises an area in which no voltage drop occurs.

14. The electro-optic device of claim 1, wherein the light emitting part is in a central region of the substrate.

15. The electro-optic device of claim 1, wherein the non-light emitting part is at an edge of the substrate.

16. The electro-optic device of claim 1, wherein an amount of the plurality of auxiliary electrodes correspond to an amount of the plurality of driving regions.

17. The electro-optic device of claim 1, wherein each of the plurality of auxiliary electrodes have a first length equal to that of the adjacent auxiliary electrodes.

18. The electro-optic device of claim 1, wherein the auxiliary electrodes comprise gold, silver, copper, aluminum, and/or a transparent conductive material.

19. The electro-optic device of claim 18, wherein the transparent conductive material comprises indium tin oxide, indium zinc oxide, zinc oxide, and/or indium oxide.

* * * * *